US006963230B2

(12) United States Patent
Morishita

(10) Patent No.: US 6,963,230 B2
(45) Date of Patent: Nov. 8, 2005

(54) INTERNAL POWER SUPPLY VOLTAGE GENERATION CIRCUIT THAT CAN SUPPRESS REDUCTION IN INTERNAL POWER SUPPLY VOLTAGE IN NEIGHBORHOOD OF LOWER LIMIT REGION OF EXTERNAL POWER SUPPLY VOLTAGE

(75) Inventor: Fukashi Morishita, Hyogo (JP)

(73) Assignee: Renesas Technology Corp., Tokyo (JP)

(*) Notice: Subject to any disclaimer, the term of this patent is extended or adjusted under 35 U.S.C. 154(b) by 630 days.

(21) Appl. No.: 09/987,566

(22) Filed: Nov. 15, 2001

(65) Prior Publication Data

US 2002/0030538 A1 Mar. 14, 2002

Related U.S. Application Data

(63) Continuation of application No. 09/739,227, filed on Dec. 19, 2000, now Pat. No. 6,329,873, which is a continuation of application No. 09/149,079, filed on Sep. 8, 1998, now Pat. No. 6,184,744.

(30) Foreign Application Priority Data

Feb. 16, 1998 (JP) ................................ 10-032749

(51) Int. Cl.[7] ................................................ H03K 5/22
(52) U.S. Cl. ........................................... 327/77; 327/89
(58) Field of Search .............................. 327/53, 56, 63, 327/65, 66, 77, 89, 563

(56) References Cited

U.S. PATENT DOCUMENTS

| | | | | |
|---|---|---|---|---|
| 5,321,653 A | | 6/1994 | Suh et al. | 365/189 |
| 5,349,559 A | | 9/1994 | Park et al. | 365/201 |
| 5,357,149 A | * | 10/1994 | Kimura | 327/512 |
| 5,373,226 A | * | 12/1994 | Kimura | 323/313 |
| 5,373,477 A | | 12/1994 | Sugibayashi | 365/226 |
| 5,467,046 A | * | 11/1995 | Kimura | 327/351 |
| 5,504,452 A | | 4/1996 | Takenaka | 327/541 |
| 5,550,493 A | * | 8/1996 | Miyanishi | 327/307 |
| 5,696,465 A | | 12/1997 | Ishizuka | 327/544 |
| 5,812,022 A | * | 9/1998 | Hirano et al. | 327/391 |
| 5,856,756 A | | 1/1999 | Sasahara et al. | 365/201 |
| 5,862,091 A | * | 1/1999 | Bion et al. | 327/391 |
| 5,910,924 A | | 6/1999 | Tanaka et al. | 327/541 |
| 6,072,349 A | * | 6/2000 | Pippin et al. | 327/53 |
| 6,104,216 A | * | 8/2000 | Satoh | 327/53 |
| 6,184,744 B1 | | 2/2001 | Morishita | 327/541 |

FOREIGN PATENT DOCUMENTS

JP 6-103793 4/1994

* cited by examiner

*Primary Examiner*—Terry D. Cunningham
(74) *Attorney, Agent, or Firm*—McDermott Will & Emery LLP

(57) ABSTRACT

An internal power supply voltage generation circuit includes a main amplifier that supplies a current from an external power supply node to an internal power supply line in accordance with the difference between a reference voltage from a reference voltage generation circuit and an internal power supply voltage on the internal power supply line. The current supply amount by the main amplifier is adjusted by a level adjust circuit, according to the difference between the external power supply voltage and the reference voltage. The internal power supply voltage generation circuit can suppress reduction in the internal power supply voltage in the vicinity of the lower limit area of the differential power supply voltage.

2 Claims, 10 Drawing Sheets

INTERNAL POWER SUPPLY VOLTAGE GENERATION CIRCUIT THAT CAN SUPPRESS REDUCTION IN INTERNAL POWER SUPPLY VOLTAGE IN NEIGHBORHOOD OF LOWER LIMIT REGION OF EXTERNAL POWER SUPPLY VOLTAGE

This application is a continuation of U.S. application Ser. No. 09/739,227, filed Dec. 19, 2000 now U.S. Pat. No. 6,329,873, which is a continuation of U.S. application Ser. No. 09/149,079, filed Sep. 8, 1998, now U.S. Pat. No. 6,184,744.

BACKGROUND OF THE INVENTION

1. Field of the Invention

The present invention relates to an internal power supply voltage generation circuit for generating an operating power supply voltage used by internal circuitry within a device, and more particularly, to an internal power supply voltage-down converter for down-converting an external power supply voltage to generate an internal power supply voltage as the operating power supply voltage.

2. Description of the Background Art

It is effective to reduce the operating power supply voltage for the purpose of reducing power consumption. With reduction of the power supply voltage, the charging/discharging current of a load capacitance becomes lower. Therefore, reducing the power supply voltage allows the power consumption to be reduced in proportion to the square of the voltage reduction ratio (load resistance such as interconnection resistance is constant). For example, in the case of a general-purpose memory that is widely used, the gate length of a transistor used in internal circuitry is scaled-down to the vicinity of the limit in microminiaturization for each generation for speeding up, to improve the integration density and operation speed. By using an on-chip voltage drop circuit, external power supply voltage is down-converted to generate an internal power supply voltage for the memory. The down-converted internal power supply voltage prevents dielectric breakdown and the like of a microminiaturized transistor, so that higher reliability and lower power consumption by reduction in voltage can be realized. The usage of this on-chip voltage drop circuit allows the externally supplied power supply voltage to be equal to the power supply voltage of an externally provided LSI of general usage. Therefore, a system can be developed with a single power source.

This voltage-drop system is also characterized in that, when the down-converted voltage is set constant at a level sufficiently lower than the external power supply voltage, the constant level is maintained even in the event of variation in the external power supply voltage to allow stable operation of internal circuitry.

FIG. 13 shows an example of a structure of a conventional internal power supply voltage generation circuit. Referring to FIG. 13, a conventional internal power supply voltage generation circuit includes a reference voltage generation circuit RG receiving current from an external power supply node EXV as an external power supply source that supplies externally applied power supply voltage ExtVcc for generating a reference voltage Vref, a subamplifier SA for supplying a current from external power supply node EXV to an internal power supply line IVL according to a result of comparison between reference voltage Vref from reference voltage generation circuit RG and an internal power supply voltage IntVcc on internal power supply line IVL, and a main amplifier MA activated, when an activation control signal ACT that is activated during operation of internal circuitry (not shown) is activated, for supplying current from external power supply node EXV to internal power supply line IVL according to the result of comparison between reference voltage Vref and internal power supply voltage IntVcc.

The current supply ability of main amplifier MA is set sufficiently greater than the current supply ability of sub-amplifier SA. When internal power supply voltage IntVcc on internal power supply line IVL is consumed during operation of internal circuitry, main amplifier MA operates at high speed to supply a current with great drivability to suppress reduction in internal power supply voltage IntVcc.

Reference voltage generation circuit RG includes a constant current circuit CCS for generating a constant current i independent of external power supply voltage ExtVcc, and a current/voltage converter CVC for converting the current of constant current circuit CCS into voltage to generate reference voltage Vref.

Constant current circuit CCS includes a p channel MOS (insulated gate field effect) transistor P1 connected between external power supply node EXV and a node ND1 and having a gate connected to node ND1, a resistor R having one end connected to external power supply node EXV, a p channel MOS transistor P2 connected between resistor R and a node ND2 and having a gate connected to node ND1, an n channel MOS transistor N1 connected between node ND1 and the ground node and having its gate connected to node ND2, an n channel MOS transistor N2 connected between node ND2 and the ground node and having its gate connected to node ND2, and a p channel MOS transistor P3 for supplying a current from external power supply node EXV according to the level of the voltage on node ND1. MOS transistors N1 and N2 form a current mirror circuit. The absolute value of a threshold voltage VTP1 of MOS transistor P1 is set greater than the absolute value VTP2 of the threshold voltage of MOS transistor P2. The operation will be described.

When MOS transistors N1 and N2 have the same size, a current of the same magnitude flows through MOS transistors N1 and N2. Therefore, a current of the same magnitude also flows through MOS transistors P1 and P2. When MOS transistors P1 and P2 are identical in size, a voltage VR expressed by the following equation is applied across resistor R from the condition that the saturation currents of MOS transistors P1 and P2 are equal to each other.

$$VR=ExtVcc-(|VTP1|-|VTP2|)$$

Therefore, a current IR flowing through resistor R is represented by the following equation.

$$IR=(ExtVcc-VR)/RR=(|VTP1|-|VTP2|)/RR$$

RR indicates the resistance of resistor R. MOS transistors P1 and P3 form a current mirror circuit. Therefore, the mirror current of current IR flowing through MOS transistor P1 flows through MOS transistor P3.

MOS transistors P4–P6 receive the ground voltage at respective gates and function as a resistor to generate a voltage according to the current supplied from MOS transistor P3. Therefore, reference voltage Vref has a level determined by the channel resistances of MOS transistors P4–P6 and the threshold voltages of MOS transistors P1 and P2. As a result, reference voltage Vref maintains a constant level independent of external power supply voltage ExtVcc (provided that external power supply voltage ExtVcc is higher than a predetermined voltage level).

Main amplifier MA includes a comparator CMM comparing reference voltage Vref and internal power supply voltage IntVcc on internal power supply line IVL, and a current drive transistor DRM formed of a p channel MOS transistor connected between external power supply node EXV and internal power supply line IVL for supplying a current from external power supply node EXV to internal power supply line IVL in accordance with an output signal from comparator CMM. Comparator CMM includes a p channel MOS transistor P7 connected between external power supply node EXV and a node NDA and having its gate connected to a node NDB, a p channel MOS transistor P8 connected between external power supply node EXV and node NDB and having its gate connected to node NDB, an n channel MOS transistor N3 connected between nodes NDB and NDC and receiving reference voltage Vref at its gate, an n channel MOS transistor N4 connected between nodes NDB and NDC and having its gate connected to internal power supply line IVL, and an n channel MOS transistor N5 connected between the ground node and node NDC and receiving activation control signal ACT at its gate.

Main amplifier MA further includes a p channel MOS transistor P9 connected between external power supply node EXV and the gate of current drive transistor DRM and receiving activation control signal ACT at its gate. The operation of main amplifier MA will be described briefly.

When activation control signal ACT is at an L level (logical low) of an inactive state, MOS transistor 5 is off. The current path of comparator CMM is cut off. Therefore, comparator CMM stops its comparison operation. The gate potential of p channel MOS transistor P9 is at the ground potential level. MOS transistor P9 conducts to electrically connect external power supply node EXV with the gate of current drive transistor DRM. Therefore, current drive transistor DRM is held at an off state. Also, node NDA is held at the level of external power supply voltage by MOS transistor P9. Therefore, when activation control signal ACT is at an inactive state of an L level, the path of the current flow in main amplifier MA is cut off, so that the current is not consumed.

When activation control signal ACT attains an H level (logical high) of an active state (the level of external power supply voltage ExtVcc), MOS transistor N5 is turned on and MOS transistor P9 is turned off. Comparator CMM carries out the comparison operation between reference voltage Vref and internal power supply voltage IntVcc. A signal corresponding to the comparison result is applied to the gate of current drive transistor DRM via node NDA. When reference voltage Vref is higher than internal power supply voltage IntVcc, the conductance of MOS transistor N3 becomes greater than the conductance of MOS transistor N4. As a result, a greater amount of current flows. MOS transistors P7 and P8 form a current mirror circuit with MOS transistor P8 being the master stage. A current of a magnitude identical to that of the current flowing through MOS transistors P8 and N4 is carried through MOS transistors P7 and N3. Therefore, MOS transistor N3 discharges the current applied from MOS transistor P7, whereby the voltage level of node NDA becomes lower. In response, the gate voltage of current drive transistor DRM is reduced. Current drive transistor DRM supplies the current from external power supply node EXV to internal power supply line IVL, whereby the level of internal power supply voltage Intvcc is raised.

In contrast, when internal power supply voltage IntVcc is higher than reference voltage Vref, the conductance of MOS transistor N4 becomes greater than the conductance of MOS transistor N3, so that the current flowing through MOS transistors P8 and N4 increases. MOS transistor N3 cannot discharge all the current supplied from MOS transistor P7. Therefore, the voltage level of node NDA is increased, whereby current drive transistor DRM is turned off. Therefore, when activation control signal ACT is active, main amplifier MA holds internal power supply voltage IntVcc at the level of reference voltage Vref.

Similar to main amplifier MA, subamplifier SA includes a comparator CMS for comparing reference voltage Vref and internal power supply voltage IntVcc, and a current drive transistor DRS formed of a p channel MOS transistor for supplying the current from external power supply node EXV to internal power supply line IVL according to the output signal from comparator CMS. The current drivability of current drive transistor DRS (=maximum drivability) is set smaller than the current drivability of current drive transistor DRM in main amplifier MA (the gate width W/gate length L is set to a small value).

Comparator CMS includes n channel MOS transistors N6 and N7 forming a comparator stage to compare reference voltage Vref and internal power supply voltage IntVcc, and p channel MOS transistors P10 and P11 forming a current mirror type current supply stage for supplying currents respectively to MOS transistors N6 and N7. P channel MOS transistor P11 supplying current to MOS transistor P7 functions as the master stage of the current mirror circuit.

Comparator CMS further includes a current source transistor N8 receiving a voltage BIASL output from node ND2 of reference voltage generation circuit RG at its gate for defining the current flowing through MOS transistors N6 and N7. MOS transistor N8 forms a current mirror with MOS transistor N2 in reference voltage generation circuit RG. The current generated from constant current generation circuit CCS is set small enough to reduce the consumed current. Therefore, the level of bias voltage BIASL is also low, so that the current driven by MOS transistor N8 is small. Therefore, comparator CMS carries out a comparison operation at a relatively small current drivability to supply a current to internal power supply line IVL via current drive transistor DRS.

Subamplifier SA has the function to suppress reduction of internal power supply voltage IntVcc due to leakage current and the like when main amplifier MA is inactive, i.e. when internal circuitry does not operate and is in a standby state. Therefore, the driven amount of current and response rate of subamplifier SA are set to a low level for the purpose of reducing power consumption. Subamplifier SA has its drive current controlled according to bias voltage BIASL, and constantly carries out a comparison operation of reference voltage Vref and internal power supply voltage Intvcc. The gate potential of drive transistor DRS is adjusted according to the comparison result. Therefore, subamplifier SA carries out an operation identical to that of an active main amplifier MA.

MOS transistor P9 suppresses the gate potential of current drive transistor DRAM from becoming unstable when MOS transistors P7 and N3 are turned off so that node NDA attains an electrically floating state in the case where the current path of comparator CMM is cut off in inactivation of activation control signal ACT in main amplifier MA. MOS transistor P9 is provided to reliably drive current drive transistor DRM to an off state when activation control signal ACT is inactive.

FIG. 14 shows the relationship between external power supply voltage ExtVcc and internal power supply voltage IntVcc. When external power supply voltage Extvcc is low, reference voltage Vref from reference voltage generation circuit RG (refer to FIG. 13) increases in proportion to external power supply voltage ExtVcc. This is because a constant current is not generated in constant current generation circuit CCS when external power supply voltage ExtVcc is low, so that the current supplied by MOS transistor P3 is proportional to external power supply voltage ExtVcc. Therefore, when the level of reference voltage Vref is changed according to external power supply voltage Extvcc, the level of internal power supply voltage IntVcc also varies according to external power supply voltage ExtVcc. Even when activation control signal ACT is in an inactive state of an L level, the level of internal power supply voltage IntVcc is raised according to the rise of reference voltage Vref because of the operation of subamplifier SA.

When external power supply voltage ExtVcc exceeds a certain voltage level VF, a constant current is conducted stably (at a voltage level where the feedback operation by the current mirror circuit is stabilized) via MOS transistors P1, P2, N1 and N2 in constant current circuit CCS. In response, the current supplied from MOS transistor P3 also becomes constant, so that reference voltage Vref is constant at the level of voltage VF. Even if external power supply voltage ExtVcc rises thereafter, reference voltage Vref is maintained at the constant level of voltage VF. Accordingly, internal power supply voltage IntVcc is also held at the constant level of voltage VF. Thus, as shown in FIG. 14, internal power supply voltage IntVcc varies according to reference voltage Vref, and is held at the constant voltage level in the flat region independently of change in the level of external power supply voltage ExtVcc. Therefore, internal circuitry can operate stably, independent of variation in external power supply voltage ExtVcc.

FIG. 15 shows the relationship between external power supply voltage ExtVcc and internal power supply voltage IntVcc in the actual operation of the circuitry. In the region where the difference between internal power supply voltage IntVcc and external power supply voltage ExtVcc (the difference between reference voltage Vref and external power supply voltage ExtVcc) is small, i.e. in the region near the lower limit of the operating condition, the gain of the internal power supply voltage generation circuit is reduced, as will be described afterwards. As a result, internal power supply voltage IntVcc cannot be raised to the required level of VF even if it is reduced in level at the time of operation of internal circuitry. The level of internal power supply voltage IntVcc will become lower than the voltage level VF of reference voltage Vref. More specifically, particularly in a high speed operation mode where internal circuitry operates at high speed (for example, when the RAS cycle is short and the sense amplifier is repeatedly activated, or when the CAS cycle is short and the internal column related circuitry operates repeatedly at high speed for writing/reading data, in a DRAM), internal power supply voltage Intvcc is consumed so that the voltage level varies in an alternate current manner. When viewed in a direct current manner, internal power supply voltage IntVcc is lower in level than the required voltage level of VF. In the case where external power supply voltage ExtVcc is, for example, 2.5 V corresponding to the lower limit of the operating condition, internal power supply voltage IntVcc is lower approximately by 0.5 V than the required voltage level of 2.0 V. This reduction in the level of internal power supply voltage IntVcc causes degradation in the current drivability of a transistor forming the internal circuitry. It will become difficult for the internal circuitry to operate at high speed. The reason why internal power supply voltage Intvcc becomes lower than the level of reference voltage Vref will be described.

FIG. 16 shows the internal voltage level of main amplifier MA. Activation control signal ACT is changed between the level of external power supply voltage ExtVcc and ground voltage. Current source transistor N5 of comparator CMM in main amplifier MA has its channel length set relatively large to adjust the current consumption in comparator CMM to, for example, approximately 1 to 2 mA. This means that the ON resistance of current source transistor N5 is relatively great, so that the drain voltage of current source transistor N5 is approximately 1.0 V. Current source transistor N5 has its drain connected to the respective sources of MOS transistors N3 and N4. Therefore, even when the conductance of MOS transistor N3 becomes greater than the conductance of MOS transistor N4 so that the voltage level of node NDA is reduced, the voltage level thereof will not become lower than the level of the drain voltage of current source transistor N5. Therefore, node NDA will have a voltage level of 1.0 V at lowest.

Current drive transistor DRM supplies current from external power supply node EXV to internal power supply line IVL, according to the voltage level on node NDA. This current source transistor DRM formed of a p channel MOS transistor supplies current according to the difference between the voltage level of node NDA and the level of the external power supply voltage ExtVcc applied to external power supply node EXV. Therefore, reduction in external power supply voltage ExtVcc causes the gate-source voltage Vgs of current drive transistor DRAM to be further reduced, so that current cannot be supplied at high speed from external power supply node EXV to internal power supply line IVL. As a result, the gain of main amplifier MA is reduced. Therefore, internal power supply voltage Intvcc, when consumed and lowered, cannot be raised to the level of reference voltage Vref. Internal power supply voltage IntVcc will be maintained at a level lower than the level of reference voltage Vref.

Particularly when the difference between external power supply voltage ExtVcc and reference voltage Vref, i.e., internal power supply voltage IntVcc, becomes small, the voltage drop of internal power supply voltage IntVcc at the lower limit of the operating condition shown in FIG. 15 becomes as great as 0.5 V, for example, which is not a negligible level. Thus, there was a problem that internal circuitry cannot be operated at high speed.

Particularly in the case where internal power supply voltage IntVcc is reduced during operation of internal circuitry, external power supply voltage ExtVcc is consumed to compensate for this reduction in internal power supply voltage IntVcc. Therefore, external power supply voltage ExtVcc is reduced in an alternate current manner. When the difference between external power supply voltage ExtVcc and reference voltage Vref becomes smaller, the drop in internal power supply voltage IntVcc becomes greater.

When internal circuitry operates at high speed to charge/discharge a signal line, internal power supply voltage IntVcc is consumed to have the voltage level thereof reduced. Accordingly, the level of external power supply voltage ExtVcc is reduced, so that the drivability of current drive transistor DRM is degraded. As a result, the drop in internal power supply voltage IntVcc becomes greater.

This problem of reduction of internal power supply voltage IntVcc from the level of reference voltage Vref is also encountered in a level shift type voltage down converter that shifts down the level of internal power supply voltage IntVcc for comparison with reference voltage Vref, as well as in a direct feedback type voltage down converter that directly compares internal power supply voltage IntVcc with reference voltage Vref as shown in FIG. 13. This is because the drivability of the current drive transistor is restricted since the gate voltage thereof does not fall down to the level of the ground voltage, reflecting the voltage level of the internal node in the comparator not reduced down to the ground voltage level.

SUMMARY OF THE INVENTION

An object of the present invention is to provide an internal power supply voltage generation circuit that can operate internal circuitry stably over an entire operating power supply range of external power supply voltage.

Another object of the present invention is to provide an internal power supply voltage generation circuit that can have voltage level reduction of internal power supply voltage suppressed as much as possible in the lower limit of external power supply voltage operating range.

The amount of current supplied to an internal power supply line is adjusted according to the result of comparing reference voltage defining the internal power supply voltage level on the internal power supply line and external power supply voltage.

According to an aspect of the present invention, an internal power supply voltage generation circuit includes a comparator for comparing an internal power supply voltage on an internal power supply line and a reference voltage to output a signal corresponding to the difference from an output node, a current drive element connected between an external voltage source supplying an externally applied external power supply voltage and the internal power supply line, responsive to the signal from the output node of the comparator for conducting a current flow between the external voltage source and the internal power supply line, and a level adjuster for adjusting the voltage level of a signal provided from the output node of the comparator to the current drive element in accordance with the difference between the external power supply voltage and reference voltage.

According to another aspect of the present invention, an internal power supply voltage generation circuit includes a comparator for comparing an internal power supply voltage on an internal power supply line and a reference voltage to output a signal corresponding to the difference thereof, a current drive element coupled between an external voltage source supplying an external power supply voltage and the internal power supply line, responsive to the signal output from the comparator for conducting a current flow between the external voltage source and the internal power supply line, a level adjuster for providing a signal according to the difference between the external power supply voltage and the reference voltage, and an auxiliary drive element having a current drivability lower than that of the current drive element, and coupled in parallel to the current drive element between the external voltage source and the internal power supply line for conducting a current flow between the external voltage source and the internal power supply line in accordance with the signal output from the level adjuster.

By increasing the current drivability of the current drive element or rendering the auxiliary drive element conductive according to the difference between the external power supply voltage and the reference voltage determining the level of the internal power supply voltage, the amount of current supplied from the external voltage source to the internal power supply line is increased when the difference between the external power supply voltage and the reference voltage becomes small. Reduction in the gain of the internal power supply voltage generation circuit near the lower limit region of the operating range of the external power supply voltage can be suppressed. Also, the drop of internal power supply voltage can be reduced. An internal power supply voltage of a stable level can be generated over a wide operating range of the external power supply voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
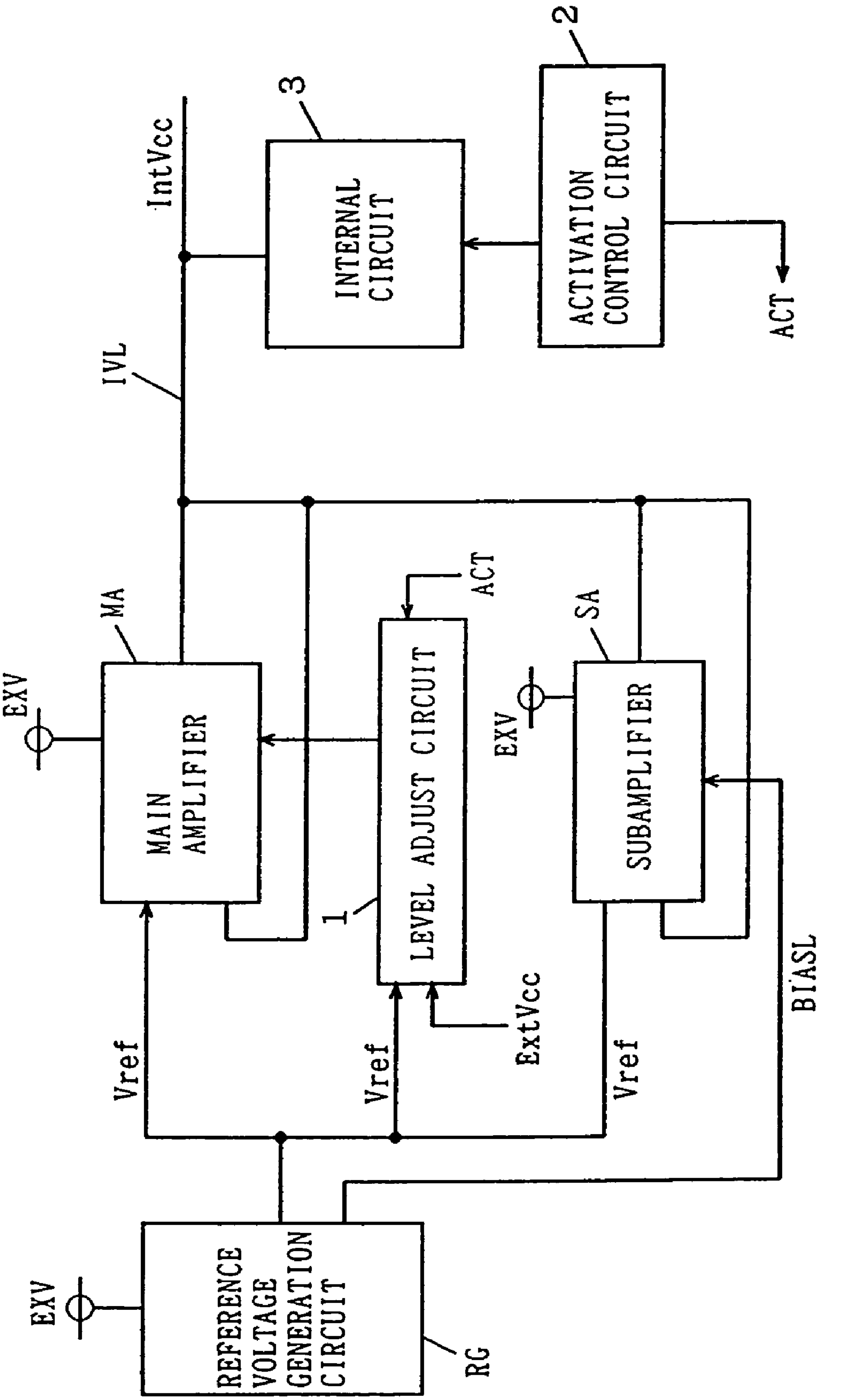
FIG. 1 schematically shows an overall structure of an internal power supply voltage generation circuit according to a first embodiment of the present invention.
Figure 14:
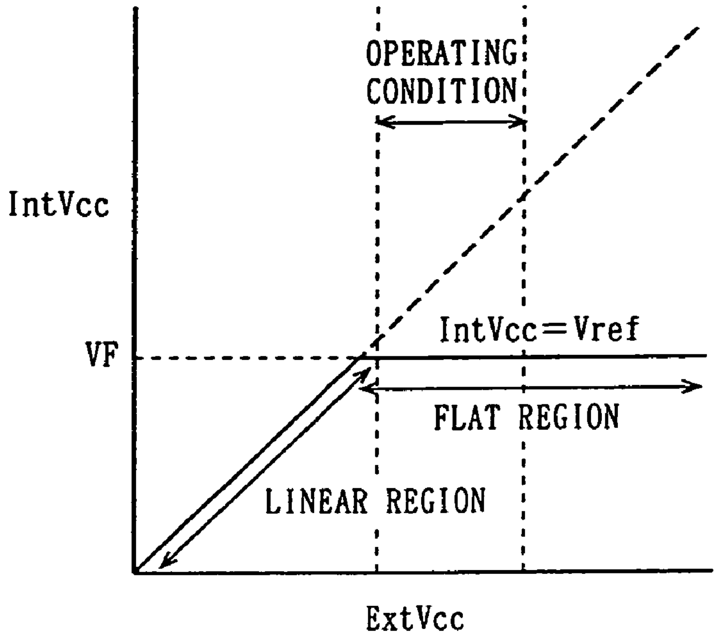
F I G. 1 4 PRIOR ART
FIG. 14 shows the relationship between internal power supply voltage and external power supply voltage of the internal power supply voltage generation circuit of FIG. 13.

FIG. 1 schematically illustrates the overall structure of a semiconductor integrated circuit device including an internal power supply voltage generation circuit according to a first embodiment of the present invention. Referring to FIG. 1, the semiconductor integrated circuit device includes a reference voltage generation circuit RG coupled to an external power supply node EXV, receiving current from this external power supply node to generate reference voltages Vref and BIASL, a subamplifier SA comparing reference voltage Vref and an internal power supply voltage IntVcc on an internal power supply line IVL for supplying a current from external power supply node EXV to internal power supply line IVL according to the comparison result, and a main amplifier MA comparing reference voltage Vref and internal power supply voltage IntVcc for supplying a current from external power supply node EXV to internal power supply line IVL according to the comparison result. Subamplifier SA has a structure similar to that of a conventional one (refer to FIG. 14) to have its operating current limited by bias voltage BIASL from reference voltage generation circuit RG.

The semiconductor integrated circuit device further includes a level adjust circuit 1 comparing reference voltage Vref and external power supply voltage ExtVcc for adjusting the amount of current supplied by main amplifier MA from external power supply node EXV to internal power supply line IVL according to the comparison result, an activation control circuit 2 for generating various control signals according to externally applied signals, and an internal circuit 3 operating under control of activation control circuit 2 to consume internal power supply voltage IntVcc on internal power supply line IVL. Activation control circuit 2 generates an activation control signal ACT determining the operating period of internal circuit 3, according to an externally applied control signal.

Internal circuit 3 may be, when the semiconductor integrated circuit device is a dynamic random access memory (DRAM), a sense amplifier circuit that senses and amplifies the data of a selected memory cell, a row/column select circuit, or a write/read circuit for writing/reading internal data.

When the semiconductor integrated circuit device is a dynamic random access memory, activation control circuit 2 controls activation/inactivation of activation control signal ACT, according to a row address strobe signal/RAS defining a memory cycle, or a column address strobe signal/CAS designating an initiation of a column select operation. When an operation mode is specified in the form of an external command such as in a synchronous semiconductor memory device, activation control circuit 2 may render activation control signal ACT active/inactive in response to an active command designating an initiation of a memory cycle or a read/write command designating data writing/reading.

Level adjust circuit 1 adjusts the amount of current supplied by main amplifier MA in accordance with the difference between external power supply voltage ExtVcc and reference voltage Vref when activation control signal ACT from activation control circuit 2 is rendered active.

When activation control signal ACT is inactive, main amplifier MA is rendered inactive to suppress or stop current consumption of main amplifier MA.

When external power supply voltage ExtVcc is substantially equal to reference voltage Vref, level adjust circuit 1 increases the amount of current supplied by main amplifier MA during activation of activation control signal ACT (external power supply node EXV and internal power supply line IVL are forced to be connected electrically). As a result, the amount of reduction of internal power supply voltage IntVcc from reference voltage Vref becomes smaller to increase the operating range of external power supply voltage Extvcc.

Figure 2:
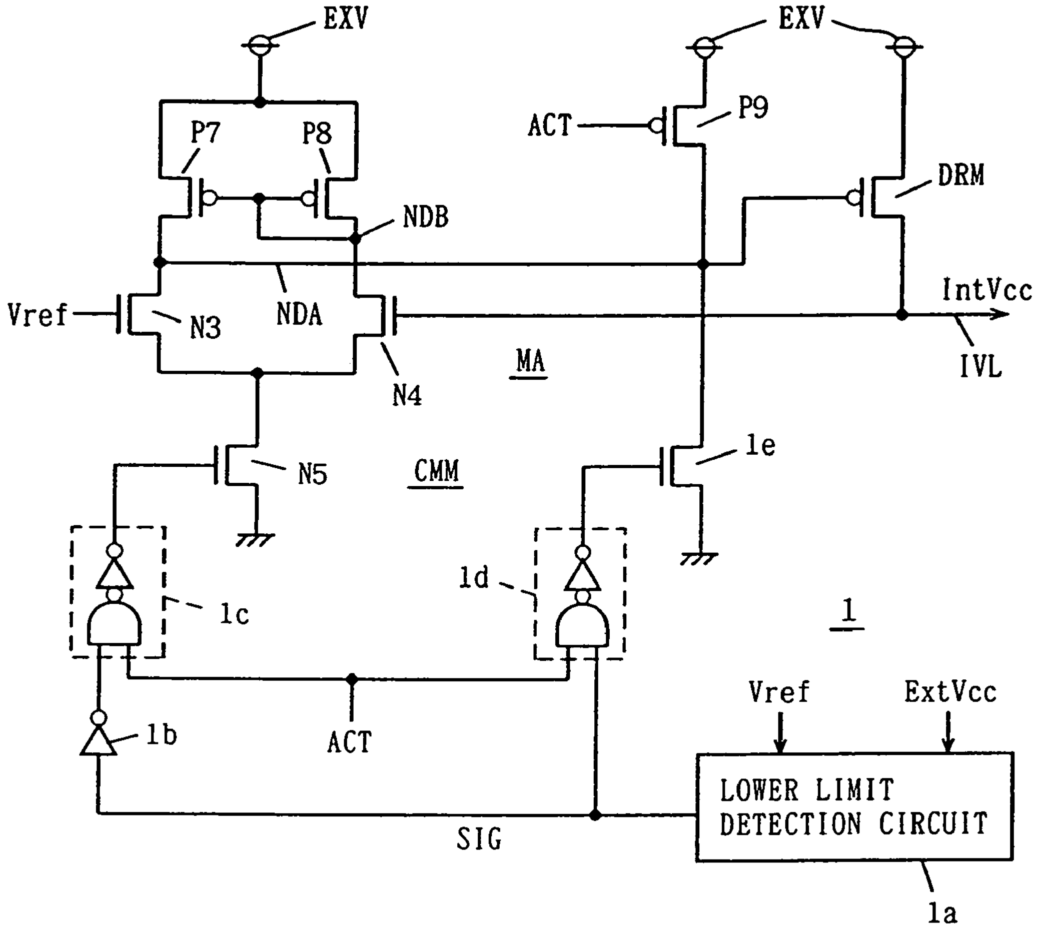
FIG. 2 shows a structure of a main amplifier and a level adjust circuit of FIG. 1.

FIG. 2 schematically shows a structure of main amplifier MA and level adjust circuit 1 of FIG. 1. Similarly to a conventional one, main amplifier MA includes a comparator CMM for comparing reference voltage Vref and internal power supply voltage IntVcc, a current drive transistor DRM for supplying current from external power supply node EXV to internal power supply line IVL in accordance with an output signal of comparator CMM, and a p channel MOS transistor P9 for electrically connecting external power supply node EXV and the gate of current drive transistor DRM during inactivation of activation control signal ACT.

Similarly to a conventional one, comparator CMM includes n channel MOS transistors N3 and N4 forming a comparator stage that compares reference voltage Vref and internal power supply voltage IntVcc, p channel MOS transistors P7 and P8 forming a current mirror type current supply stage for supplying current to MOS transistors N3 and N4, and a current source transistor N5 for determining the operating current of comparator CMM as well as controlling the activation/inactivation of comparator CMM.

Figure 3:
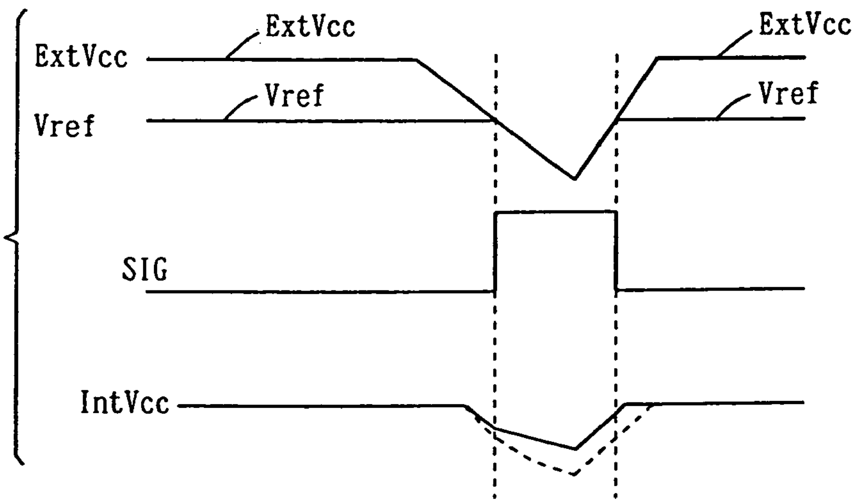
FIG. 3 is a signal waveform diagram representing an operation of the circuitry of FIG. 2.

Level adjust circuit 1 includes a lower limit detection circuit 1*a* for detecting equalization of reference voltage Vref and external power supply voltage ExtVcc, an inverter 1*b* for inverting a lower limit detection signal SIG from lower limit detection circuit 1*a*, an AND circuit 1*c* receiving activation control signal ACT and an output signal of inverter 1*b* for supplying the output signal to the gate of current source transistor N5, an AND circuit 1*d* for receiving activation control signal ACT and lower limit detection signal SIG from lower limit detection circuit 1*a*, and an n channel MOS transistor 1*e* for driving the gate (node NDA) of current drive transistor DRM to the level of the ground voltage in accordance with an output signal of AND circuit id. Each of AND circuits 1*c* and 1*d* is formed of a NAND circuit and an inverter. The operation of main amplifier MA and level adjust circuit 1 shown in FIG. 2 will be described with reference to the signal waveform diagram of FIG. 3.

When activation control signal ACT is inactive and internal circuit 3 shown in FIG. 1 is at a standby state, the output signals of AND circuits 1*c* and 1*d* are at an L level, and MOS transistors N5 and 1*e* are both off. P channel MOS transistor P9 is on, and node NDA is driven to the level of external power supply voltage ExtVcc. Comparator CMM is at an inoperative state, and current drive transistor DRM is also off. Therefore, when activation control signal ACT is inactive, main amplifier MA maintains an inactive state irrespective of the logic level of lower limit detection signal SIG even when lower limit detection circuit 1*a* carries out a detection operation so that lower limit detection signal SIG is driven to an H level/L level according to the detection result.

When activation control signal ACT is rendered active, AND circuits 1*c* and 1*d* operate as buffers. The on/off state of MOS transistors N5 and 1*e* is controlled according to lower limit detection signal SIG from lower limit detection circuit 1*a*. P channel MOS transistor P9 is off. Here, the H level of activation control signal ACT is the level of external power supply voltage ExtVcc.

Regardless of the operation of internal circuit under this state, lower limit detection signal SIG from lower limit detection circuit 1*a* attains an L level, output signal of AND circuit 1*c* attains an H level, and the output signal of AND circuit 1*d* attains an L level when external power supply voltage ExtVcc is sufficiently higher than reference voltage Vref. Under this state, MOS transistor N5 is on and MOS transistor 1*e* is off. Comparator CMM compares reference voltage Vref and internal power supply voltage IntVcc. Current drive transistor DRM supplies a current from external power supply node EXV to internal power supply line IVL according to the comparison result. In this state, internal power supply voltage IntVcc maintains substantially a constant voltage level.

When the level of external power supply voltage ExtVcc is reduced to approach the lower limit of the operating power supply voltage range, internal power supply voltage IntVcc becomes lower than reference voltage Vref. When external power supply voltage ExtVcc becomes equal to the level of reference voltage Vref, lower limit detection signal SIG from lower limit detection circuit 1*a* rises to an H level to cause the signal output from AND circuit 1*c* and the signal output from AND circuit 1*d* to be driven to an L level and an H level, respectively. As a result, the comparison operation of comparator CMM is stopped. MOS transistor 1*e* is turned on, and the gate of current drive transistor DRM is driven to the level of the ground voltage. Accordingly, current drive transistor DRM is deeply turned on. External voltage node EXV and internal power supply line IVL are connected to supply a greater amount of current, whereby internal power supply voltage IntVcc is driven to the level of external power supply voltage ExtVcc.

External power supply voltage ExtVcc is at a level identical to that of reference voltage Vref. Therefore, internal power supply voltage IntVcc is restored to the level of reference voltage Vref. Thus, the reduction in internal power supply voltage IntVcc caused when external power supply voltage ExtVcc becomes equal to reference voltage Vref as indicated by the dotted line in FIG. 3, can be suppressed significantly to maintain internal power supply voltage IntVcc at substantially a constant voltage level.

When the level of external power supply voltage ExtVcc is increased to become higher than reference voltage Vref, lower limit detection signal SIG from lower limit detection circuit 1*a* is pulled down to an L level. The signal output from AND circuit 1*c* and the signal output from AND circuit 1*d* attain an H level, and an L level, respectively. According to the comparison result of comparator CMM, a current is supplied from external power supply node EXV to internal power supply line IVL via current drive transistor DRM. In the increase of external power supply voltage ExtVcc, internal power supply voltage IntVcc is made equal to the level of reference voltage Vref. Therefore, internal power supply voltage IntVcc is maintained substantially at the level of reference voltage Vref even when lower limit detection signal SIG is pulled down to an L level from an H level.

When internal power supply voltage Intvcc is consumed during the operation of the internal circuit (refer to FIG. 1), current is supplied from external power supply node EXV to internal power supply line IVL, according to the reduction in internal power supply voltage IntVcc. Here, external power supply voltage ExtVcc is also reduced (in an alternating manner). Therefore, external power supply voltage ExtVcc is reduced down to the level of reference voltage Vref during fluctuation of external power supply voltage ExtVcc. When external power supply voltage ExtVcc is reduced, the current drivability of current drive transistor DRM becomes lower to result in a greater drop since the drop in internal power supply voltage IntVcc cannot be compensated for in the conventional case. However, by forcing the voltage level of the gate of current drive transistor DRM to the ground voltage when external power supply voltage ExtVcc is reduced, the supplied current through current drive transistor DRM is increased since the gate voltage of current drive transistor DRM is driven to a level lower than the attainable lowest voltage level of the conventional case. Accordingly, the gain of main amplifier MA is increased to suppress the amount of reduction in internal power supply voltage IntVcc.

When MOS transistor 1*e* is on, node NDA is driven to the level of the ground voltage. Here, current source transistor N5 of comparator CMM is off. Also, since p channel MOS transistor P7 serves as the slave stage of the current mirror circuit and current does not flow in MOS transistor P8, MOS transistor P7 is turned off (due to the H level of the voltage of node NDB). The path of the current flow from external power supply node EXV to the ground node via comparator CMM and MOS transistor 1*e* is cut off, so that there is no increase in current consumption.

Figure 4:
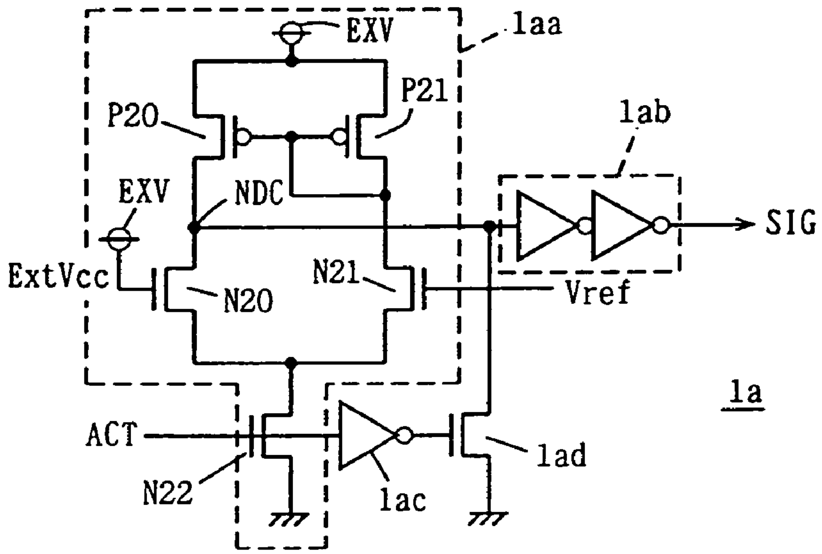
FIG. 4 shows a structure of a lower limit detection circuit of FIG. 2.

FIG. 4 shows an example of structure of a lower limit detection circuit 1*a* of FIG. 2. Referring to FIG. 4, lower limit detection circuit 1*a* includes a differential amplifier 1*aa* for comparing external power supply voltage ExtVcc of external power supply node EXV with reference voltage Vref, a buffer circuit 1*ab* formed of two stages of CMOS inverters for converting the output signal of differential amplifier 1*aa* to the CMOS level, an inverter 1ac for inverting activation control signal ACT, and an n channel MOS transistor 1*ad* for driving the output signal of differential amplifier 1*aa* to the level of the ground voltage when the output signal of inverter 1*ac* is at an H level.

Differential amplifier 1*aa* has a structure similar to that of comparator CMM in main amplifier MA. More specifically, differential amplifier 1*aa* includes n channel MOS transistors N20 and N21 forming a comparator stage to compare external power supply voltage ExtVcc and reference voltage Vref, p channel MOS transistors P20 and P21 forming a current mirror type current supply stage to supply current to MOS transistors N20 and N21, and a current source transistor N22 for rendering differential amplifier 1*aa* active when activation control signal ACT is active. P channel MOS transistor P21 functions as the master stage of this current mirror type current supply stage to supply current towards MOS transistor N21.

The operation of lower limit detection circuit 1*a* of FIG. 4 will now be described with reference to the signal waveform chart of FIG. 5. When activation control signal ACT is at an H level, current source transistor N22 conducts, and MOS transistor 1*ad* is off. Differential amplifier 1*aa* compares external power supply voltage ExtVcc and reference voltage Vref so that a lower limit detection signal SIG is output from buffer circuit 1*ab* in accordance with the comparison result.

When external power supply voltage ExtVcc is sufficiently higher than reference voltage Vref, the conductance of MOS transistor N20 becomes greater than the conductance of MOS transistor N21. Therefore, the voltage level of node NDC attains a low level. Since the voltage level of node NDC becomes lower than the input logic threshold voltage of the CMOS inverter in buffer circuit 1*ab*, lower limit detection signal SIG output from buffer circuit 1*ab* maintains the L level.

When the difference between external power supply voltage ExtVcc and reference voltage Vref becomes smaller, the difference in conductance between MOS transistors N20 and N21 becomes smaller, so that the voltage level of node NDC increases. However, since the voltage level of node NDC becomes lower than the input logic threshold voltage of the CMOS inverter of the first input stage in buffer circuit 1*ab*, lower limit detection signal SIG maintains the L level.

When there is substantially no difference between external power supply voltage ExtVcc and reference voltage Vref, the conductance between MOS transistors N20 and N21 becomes substantially equal. In this state, the voltage level of node NDC is equal to the input logic threshold voltage of the CMOS inverter at the first input stage in buffer circuit 1*ab*, so that lower limit detection signal SIG is pulled up to an H level of the power supply voltage (internal power supply voltage or external power supply voltage) by the amplifying operation of buffer circuit 1*ab*.

When activation control signal ACT is at an L level, current source transistor N22 is off and MOS transistor 1*ad* is on. Node NDC is driven to the level of the ground voltage. In this state, the current path of differential amplifier 1*aa* is cut off. Therefore, the operation of differential amplifier 1*aa* is stopped. Also, lower limit detection signal SIG from buffer circuit 1*ab* is maintained at the L level of the ground voltage.

When activation control signal ACT is inactive, MOS transistor P21 which is the master stage of the current mirror type current supply stage is off. Therefore, MOS transistor P20 is also off. The path of the current flow via MOS transistor P20 and MOS transistor 1*ad* of differential amplifier 1*aa* is cut off. Thus, the current consumption of lower limit detection circuit 1*a* during the inactive state of activation control signal ACT can be reduced.

The voltage level of node NDC is determined by the ON resistance ratio of MOS transistors P20 and N20. When external power supply voltage ExtVcc becomes equal to reference voltage Vref in the structure where the voltage level of node NDC is maintained at ½ the level of external power supply voltage ExtVcc with buffer circuit 1*ab* utilizing external power supply voltage ExtVcc as one operating power supply voltage, the input logic threshold voltage can be set to ½ external power supply voltage ExtVcc. Lower limit detection signal SIG can be driven reliably to an H level when external power supply voltage and reference voltage Vref become equal.

Figure 5:
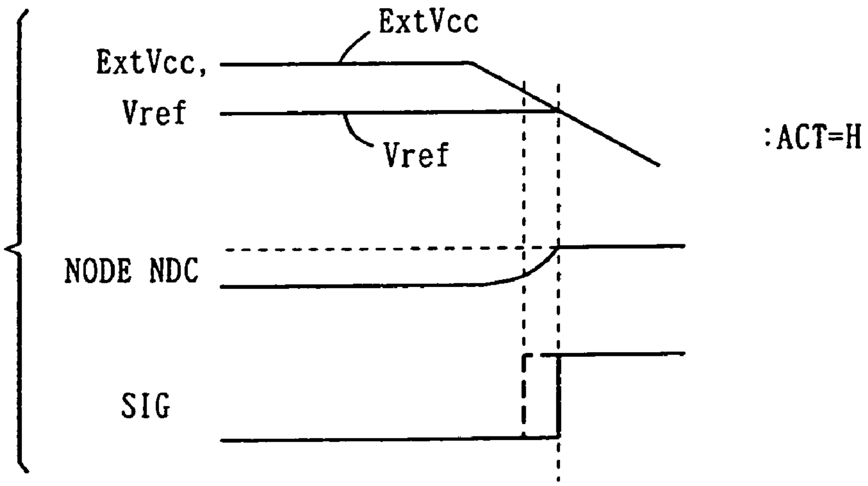
FIG. 5 is a signal waveform diagram showing the operation of the lower limit detection circuit of FIG. 4.

By adjusting the voltage level of the input logic threshold voltage of buffer circuit 1*ab*, lower limit detection signal SIG can be driven to an H level when the difference between external power supply voltage ExtVcc and reference voltage Vref becomes smaller than a predetermined value, as indicated by a broken line in FIG. 5. Lower limit detection signal SIG can be driven to an H level when external power supply voltage ExtVcc is in the vicinity of the lower limit of the operating condition.

Figure 15:
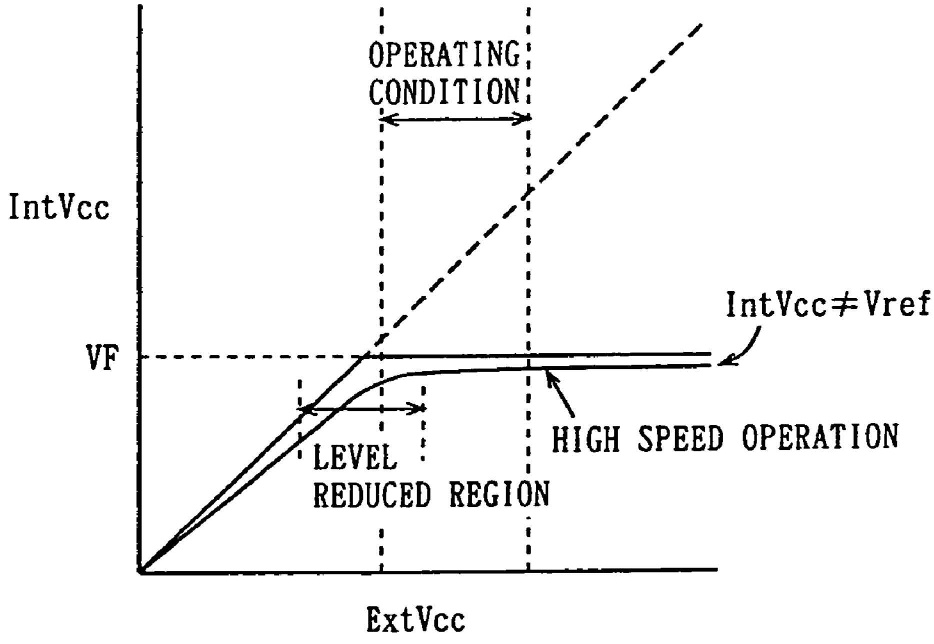
F I G. 1 5 PRIOR ART
FIG. 15 represents the relationship between the internal power supply voltage and the external power supply voltage of the internal circuitry of FIG. 13 in a high speed operation.
Figure 16:
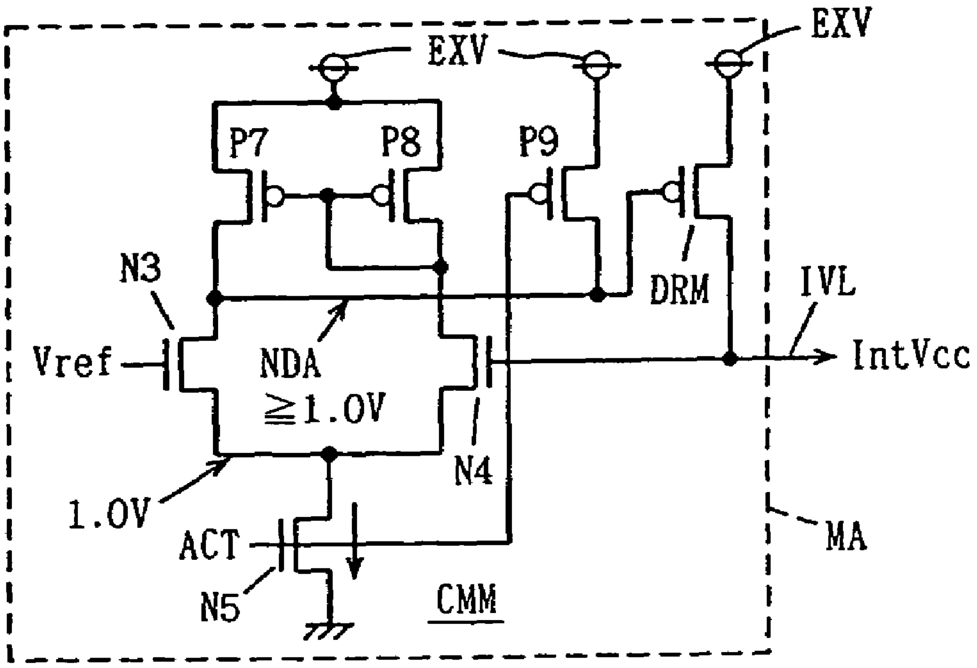
F I G. 1 6 PRIOR ART
FIG. 16 is a diagram for describing problems of the conventional internal power supply voltage generation circuit.

According to the first embodiment of the present invention, current drive transistor DRM can be driven to a completely ON state so as to compensate for reduction in the gain of main amplifier MA to suppress reduction in internal power supply voltage IntVcc to the minimum in the region where reference voltage Vref and external power supply voltage ExtVcc are substantially equal (the linear region where internal power supply voltage IntVcc changes linearly in FIG. 15).

When external power supply voltage ExtVcc is sufficiently higher than reference voltage Vref (the flat region of internal power supply voltage IntVcc in FIG. 15), comparison between reference voltage Vref and internal power supply voltage IntVcc is made to drive current drive transistor DRM in accordance with the level of internal power supply voltage IntVcc, as in the conventional case. Accordingly, internal power supply voltage Intvcc can be maintained at substantially a constant voltage level over a wide range of external power supply voltage ExtVcc. Therefore, the internal circuit can be operated stably and at high speed.

Second Embodiment

Figure 6:
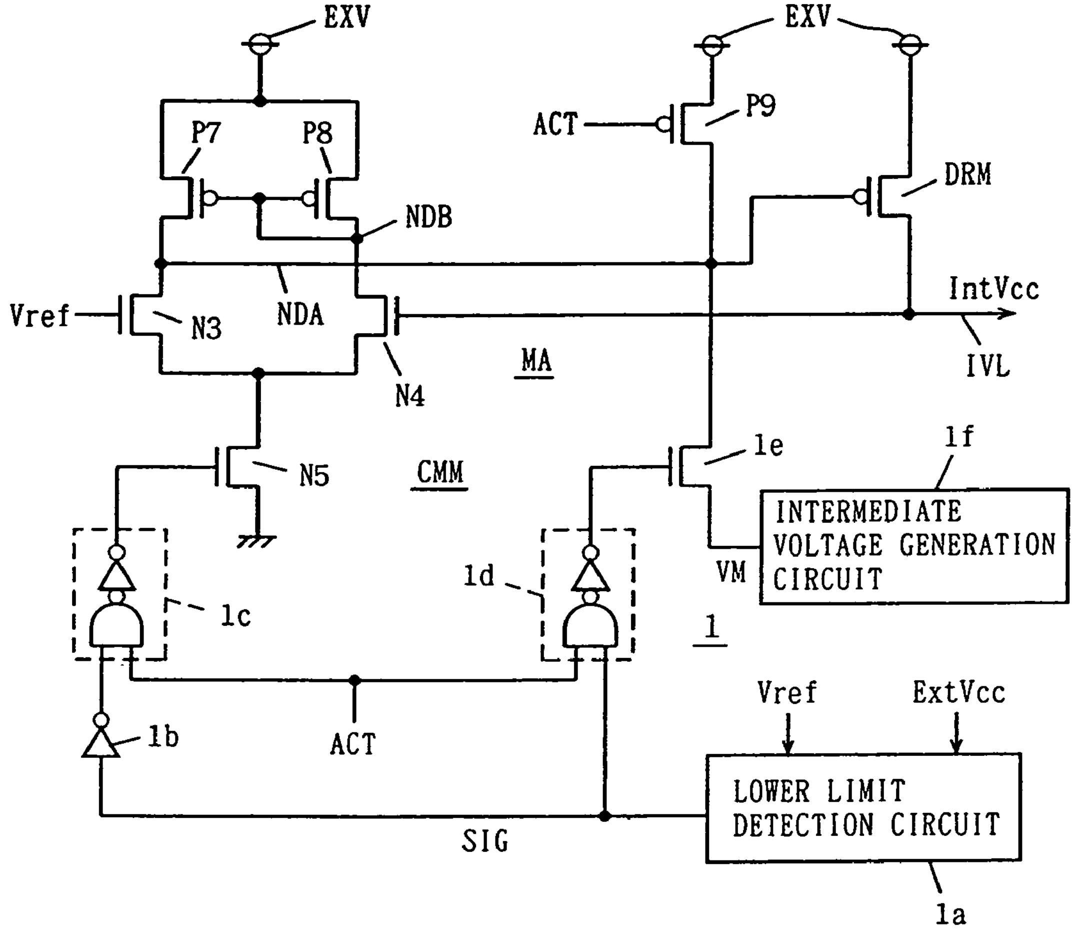
FIG. 6 shows a structure of main components of an internal power supply voltage generation circuit according to a second embodiment of the present invention.

FIG. 6 schematically shows a structure of main components of an internal power supply voltage generation circuit according to a second embodiment of the present invention. FIG. 6 shows The structure corresponding to main amplifier MA and level adjust circuit 1 as shown in FIG. 1. In the structure shown in FIG. 6, an intermediate voltage from an intermediate voltage generation circuit if is applied to the source of MOS transistor 1*e* that adjusts the gate potential of current drive transistor DRM in level adjust circuit 1. The remaining structure is identical to that shown in FIG. 2. Therefore, corresponding components have the same reference characters allotted, and detailed description thereof will not be repeated.

Figure 7:
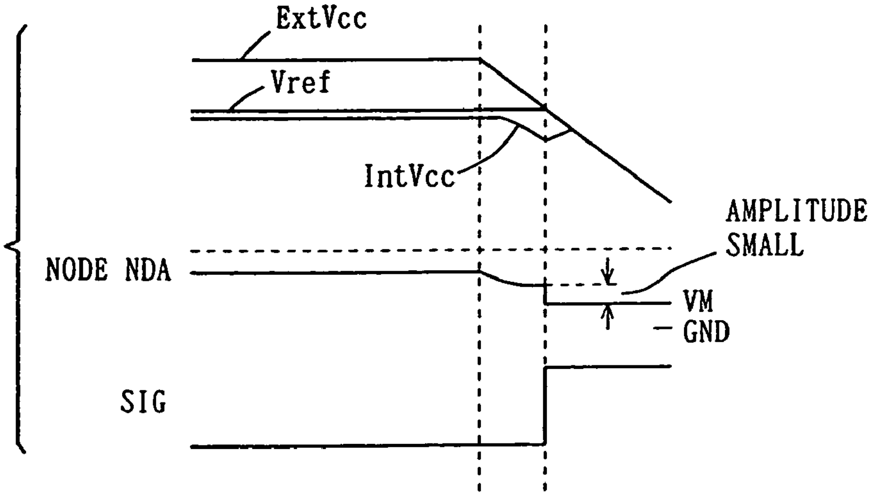
FIG. 7 is a signal waveform diagram representing an operation of the circuitry of FIG. 6.

Intermediate voltage VM from intermediate voltage generation circuit if is of a level at which current drive transistor DRM is sufficiently turned on. For example, intermediate voltage VM is set to 1.0 V when external power supply voltage ExtVcc is, for example, 3.3 V. The operation of the circuit shown in FIG. 6 will now be described with reference to the waveform diagram of FIG. 7.

When the difference between external power supply voltage ExtVcc and reference voltage Vref is sufficiently large, internal power supply voltage IntVcc is maintained at the voltage level of reference voltage Vref. The voltage level of node NDA of comparator CMM in main amplifier MA is maintained at a level according to the difference between reference voltage Vref and internal power supply voltage IntVcc. In this state, lower limit detection signal SIG is at an L level.

When external power supply voltage Extvcc is reduced so that the difference between reference voltage Vref and external power supply voltage ExtVcc becomes smaller, internal power supply voltage Intvcc is also reduced in level. The voltage level of node NDA is also reduced according to the difference between internal power supply voltage IntVcc and reference voltage Vref. The lower limit of the voltage level of node NDA in comparator CMM is the level of the drain voltage of current source transistor N5. When external power supply voltage ExtVcc becomes equal to reference voltage Vref, lower limit detection signal SIG attains an H level. The comparison operation of comparator CMM is suppressed, and MOS transistor 1*e* is turned on. Intermediate voltage VM generated from intermediate voltage generation circuit if is transmitted to the gate of current drive transistor DRM.

Intermediate voltage VM is lower than the lower limit voltage level of node NDA. Current drive transistor DRM is supplied with a constant intermediate voltage VM independent of the difference between internal power supply voltage IntVcc and reference voltage Vref. Current is supplied from external power supply node EXV to internal power supply line IVL to increase the voltage level of internal power supply voltage IntVcc.

Intermediate voltage VM from intermediate voltage generation circuit If is a direct current voltage and maintained at a constant level. Node NDA varies in an alternating current manner according to the difference between reference voltage Vref and internal power supply voltage IntVcc when comparator circuit CMM is active. Therefore, even when the voltage level of node NDA is reduced to the level of approximately 1.0 V, node NDA is at a voltage level changing in an alternating current manner to attain a voltage level higher than the lower limit voltage level in a direct current manner. Therefore, even when intermediate voltage VM from intermediate voltage generation circuit 1*f* is, for example, 1.0 V, the current drivability of current drive transistor DRM can be increased reliably to suppress the amount of reduction in internal power supply voltage IntVcc.

By supplying intermediate voltage VM to the gate of current drive transistor DRM, the great change in the voltage level of node NDA in the vicinity of the lower limit range of external power supply voltage ExtVcc can be suppressed. More specifically, when internal power supply voltage IntVcc is consumed by the operation of the internal circuit so that external power supply voltage ExtVcc is changed, lower limit detection signal SIG repeats the H level and the L level. At the transition of the voltage level of node NDA from an intermediate voltage level to the ground voltage level, the width of change in the gate voltage of current drive transistor DRM is great. Therefore, there is a possibility that the gate voltage of current drive transistor DRM may become unstable and that current drive transistor DRM cannot operate stably. By using intermediate voltage VM, the voltage amplitude of node NDA, i.e., the gate of current drive transistor DRM, can be reduced, and the width of change of the gate voltage of current drive transistor DRM in the lower limit region of external power supply voltage ExtVcc can be reduced. Therefore, activation/inactivation of main amplifier MA and comparator CMM and adjustment of the amount of supply current of current transistor DRM can be effected accurately according to the difference between external power supply voltage ExtVcc and reference voltage Vref.

Similarly to the circuit generating reference voltage Vref, intermediate voltage generation circuit 1*f* can be formed of a constant current source and a resistor receiving a current from the constant current source. Alternatively, the intermediate voltage can be generated taking advantage of the threshold voltage of a diode-connected MOS transistor. Further, intermediate voltage VM can be generated by transmitting the reference voltage Vref in a source follower mode followed by voltage drop through a diode-connected MOS transistor by a required voltage level.

According to the second embodiment of the present invention, the gate voltage of the current drive transistor is set to the intermediate voltage level. Therefore, when external power supply voltage ExtVcc and reference voltage Vref becomes substantially equal during the operation of the internal circuit, the gate voltage of the current drive transistor can be suppressed from varying significantly at the lower limit region of the external power supply voltage. Thus the current supply operation of current drive transistor can be stabilized.

Third Embodiment

Figure 8:
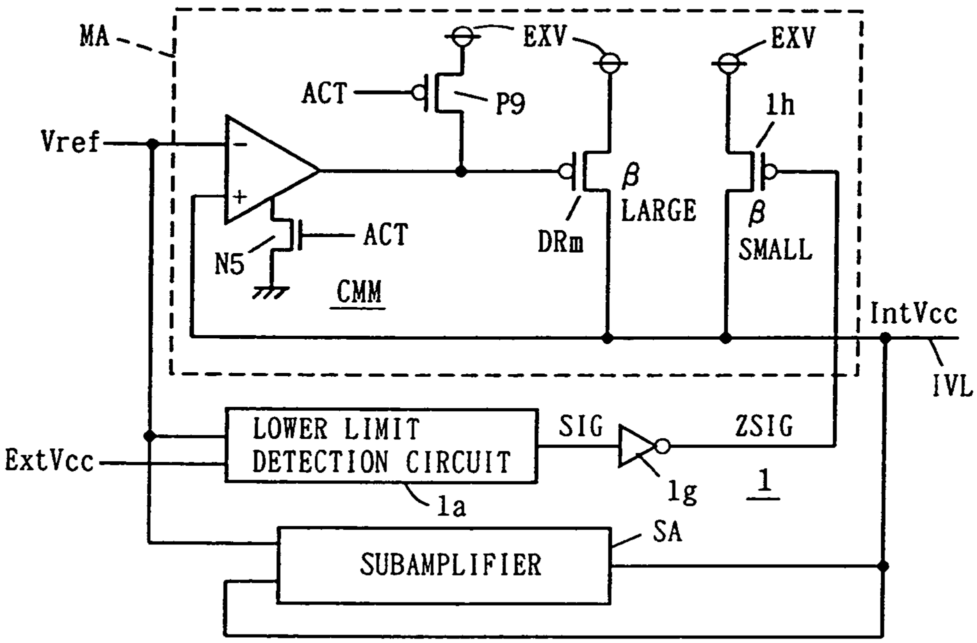
FIG. 8 schematically shows a structure of main components of an internal power supply voltage generation circuit according to a third embodiment of the present invention.

FIG. 8 schematically shows a structure of an internal power supply voltage generation circuit according to a third embodiment of the present invention. Referring to FIG. 8, main amplifier MA includes a comparator CMM for comparing reference voltage Vref and internal power supply voltage IntVcc, a current drive transistor DRm for supplying current from external power supply node EXV to internal power supply line IVL in accordance with an output signal of comparator CMM, and an auxiliary drive transistor 1*h* provided parallel to current drive transistor DRm and formed of a p channel MOS transistor for supplying current from external power supply node EXV to internal power supply line IVL when made conductive. The size DRm (current supply ability: gate width) of current drive transistor is set smaller than the size of current drive transistor DRM of the first and second embodiments. The current drivability (size: channel width) of MOS transistor 1*h* is set smaller than that of current drive transistor DRm. The total size (channel width) of current drive transistor DRm and MOS transistor 1*h* for level adjustment is set equal to the size (channel width) of the current drive transistor DRM of the first and second embodiments.

Main amplifier MA further includes a p channel MOS transistor P9 that electrically connects the gate of current drive transistor DRm to external power supply node EXV when activation control signal ACT is inactive. Comparator CMM compares internal power supply voltage IntVcc and reference voltage Vref when activation control signal ACT is active.

Level adjust circuit 1 includes a lower limit detection circuit 1*a* for comparing external power supply voltage ExtVcc and reference voltage Vref, and an inverter 1*g* for inverting lower limit detection signal SIG from lower limit detection circuit 1*a* and providing the inverted signal to auxiliary drive transistor 1*h*. Signal ZSIG output from inverter 1*g* changes between external power supply voltage ExtVcc and ground voltage to drive the MOS transistor for level adjustment (auxiliary drive transistor) 1*h* to an on/off state.

Lower limit detection circuit 1*a* has a structure identical to that of FIG. 4 to drive lower limit detection signal SIG to an active state of an H level when external power supply voltage ExtVcc and reference voltage Vref become substantially equal.

The internal power supply voltage generation circuit further includes a subamplifier SA that constantly operates to maintain the voltage level of internal power supply voltage IntVcc in a standby state.

In the structure shown in FIG. 8, main amplifier MA constantly carries out a comparison operation when activation control signal ACT is active. When the difference between external power supply voltage ExtVcc and reference voltage Vref becomes smaller to reduce the gain of main amplifier MA so that the difference between internal power supply voltage IntVcc and reference voltage Vref becomes greater, lower limit detection signal SIG from lower limit detection circuit 1*a* attains an H level. In response, lower limit detection signal ZSIG from inverter 1*g* attains an L level. Level adjusting MOS transistor 1*h* is turned on, and current is supplied from external power supply node EXV to internal power supply line IVY. Reduction in the drivability of current drive transistor DRm is compensated for by level adjusting MOS transistor 1*h* to suppress reduction in the voltage level of internal power supply voltage IntVcc. The size (channel width) of level adjusting MOS transistor 1*h* is set small and the current drivability thereof is relatively small. Therefore, it is prevented that a great current is rapidly supplied to internal power supply line IVL when level adjusting MOS transistor 1*h* is turned on to suddenly raise the level of internal power supply voltage IntVcc (ringing suppression).

When the difference between reference voltage Vref and external power supply voltage ExtVcc is sufficiently great, lower limit detection signal SIG from lower limit detection circuit 1_a_ is at an L level. Output signal ZSIG from inverter 1_g_ is at the level of external power supply voltage ExtVcc, and auxiliary drive transistor 1_h_ is off. In this state, current drive transistor DRm supplies current from external power supply node EXV to internal power supply line IVL, according to the difference between internal power supply voltage IntVcc and reference voltage Vref.

[Modification]

Figure 9:
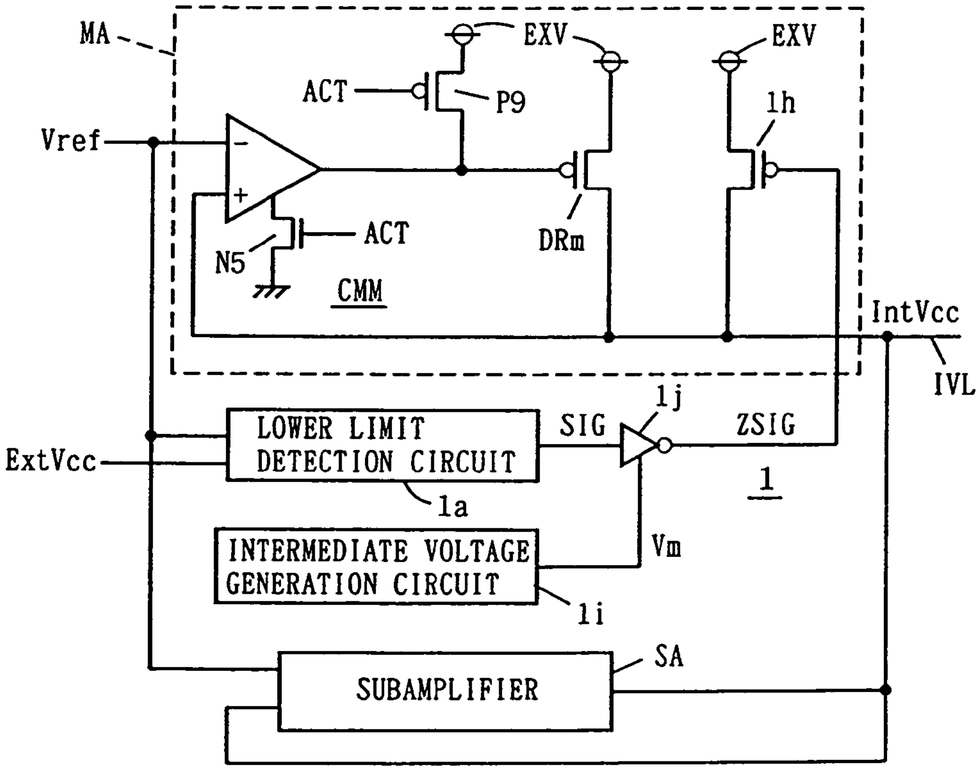
FIG. 9 schematically shows a structure of a modification of the third embodiment.

FIG. 9 shows a modification of the third embodiment of the present invention. Referring to FIG. 9, level adjust circuit 1 includes an inverter 1_j_ for inverting lower limit detection signal SIG from lower limit detection circuit 1_a_, for providing to the gate of level adjusting MOS transistor 1_h_, and an intermediate voltage generation circuit 1_i_ for restricting the L level of the output signal of inverter 1_j_ to intermediate voltage Vm. The remaining structure is similar to that shown in FIG. 8, and corresponding components have the same reference characters allotted.

In the structure shown in FIG. 9, lower limit detection signal ZSIG output from inverter 1_j_ changes between external power supply voltage ExtVcc and intermediate voltage Vm. Therefore, level adjusting MOS transistor 1_h_ is prevented from being completely turned on. In the structure where lower limit detection signal SIG output from lower limit detection circuit 1_a_ attains an active state when external power supply voltage ExtVcc is slightly higher than reference voltage Vref, internal power supply voltage IntVcc may possibly be driven to a level higher than reference voltage Vref when level adjusting MOS transistor 1_h_ is turned on completely. By providing the lower limit of the gate voltage of level adjusting MOS transistor 1_h_ to intermediate voltage Vm and adjusting the amount of current to be supplied, the response speed can be slightly lowered to prevent internal power supply voltage IntVcc from changing at high speed to become higher than reference voltage Vref. Also, a sudden flow of a large current from external power supply node EXV to cause increase in level of internal power supply voltage IntVcc due to ringing is prevented at the transition of level adjusting MOS transistor 1_h_ to an ON state. Intermediate voltage Vm generated by intermediate voltage generation circuit 1_i_ is determined according to the amount of current supplied by level adjusting MOS transistor 1_h_ and the difference between external power supply voltage ExtVcc and reference voltage Vref upon transition of lower limit detection signal SIG to an active state.

According to the third embodiment of the present invention, a comparison operation is constantly carried out by the main amplifier during operation of the internal circuit to drive auxiliarily level adjusting MOS transistor 1_h_ to an ON state in the region where there is possibility of reduction in the gain. Therefore, reduction in the gain of main amplifier MA can be suppressed to prevent reduction in the level of internal power supply voltage IntVcc. By providing current drive transistor DRm and level adjusting MOS transistor (auxiliary drive transistor) 1_h_ in parallel, it is not necessary to account for the switching characteristic of current drive transistor DRm in the vicinity of the lower limit of external power supply voltage ExtVcc. An internal power supply voltage generation circuit can be implemented that generates an internal power supply voltage IntVcc of a constant voltage level stably over a wide voltage range of the external power supply voltage.

Fourth Embodiment

Figure 10:
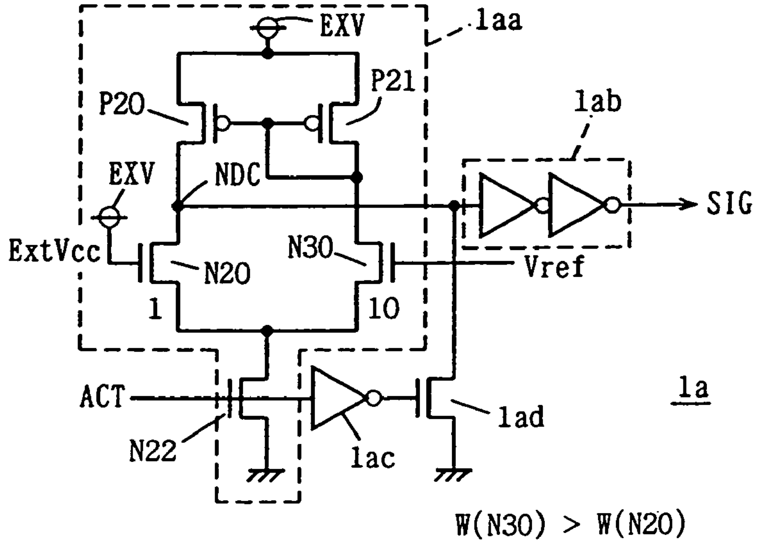
FIG. 10 schematically shows a structure of main components of an internal power supply voltage generation circuit according to a fourth embodiment of the present invention.

FIG. 10 shows a structure of a main portion of an internal power supply voltage according to a fourth embodiment of the present invention. The structure of lower limit detection circuit 1_a_ is shown in FIG. 10. Lower limit detection circuit 1_a_ of FIG. 10 differs in structure from the lower limit detection circuit of FIG. 4 in that the channel widths (W) of n channel MOS transistors N20 and N30 forming the comparator stage in differential amplifier 1_aa_ differ from each other. The remaining structure is similar to that shown in FIG. 4, and corresponding components have the same reference characters allotted, and detailed description thereof will not be repeated.

According to the structure shown in FIG. 10, the channel width W (N30) of n channel MOS transistor N30 receiving reference voltage Vref at its gate is set to ten times, for example, the channel width W (N20) of n channel MOS transistor N20 that receives external power supply voltage ExtVcc at its gate. Therefore, the amount of current that can be driven by n channel MOS transistor N30 (current drivability: current drivability under the same gate voltage) is set sufficiently greater than the amount of current that can be driven by n channel MOS transistor N20. The operation of lower limit detection circuit 1_a_ of FIG. 10 will be now described with reference to the waveform diagrams of FIGS. 11A and 11B.

Figure 11A:
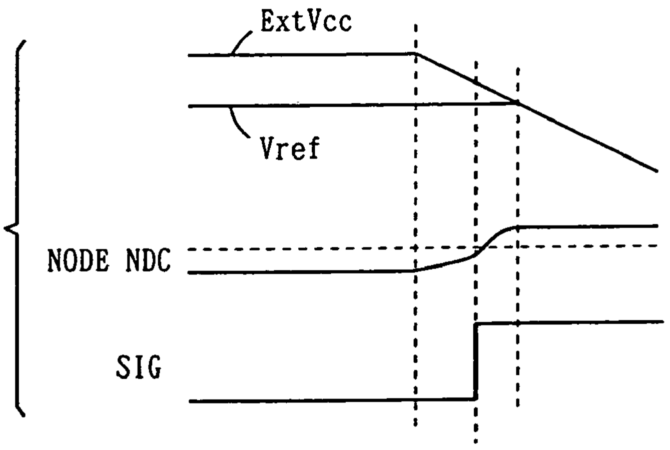
FIGS. 11A and 11B are signal waveform diagrams representing an operation of the lower limit detection circuit of FIG. 10.

The normal level adjustment operation of an internal power supply voltage will be described with reference to FIG. 11A. P channel MOS transistors P20 and P21 have the same size, and supply the same amount of current. Therefore, a current identical to that flowing via n channel MOS transistor N30 is supplied to n channel MOS transistor N20 via p channel MOS transistor P20. When the difference between external power supply voltage ExtVcc and reference voltage Vref is great enough, n channel MOS transistor N20 discharges the current supplied from p channel MOS transistor P20 so that the voltage level of node NDC attains a level lower than the intermediate voltage level even if the channel width of n channel MOS transistor N30 is set greater than the channel width of n channel MOS transistor N20.

When the difference between external power supply voltage ExtVcc and reference voltage Vref becomes smaller, the voltage level of node NDC is increased. When the difference between external power supply voltage ExtVcc and reference voltage Vref attains a predetermined value, the amount of current flowing through MOS transistors N20 and N30 becomes the same even when reference voltage Vref is lower than external power supply voltage ExtVcc. The voltage level of node NDC attains the intermediate voltage level to exceed the input logic threshold voltage of buffer circuit 1_ab_. Lower limit detection signal SIG rises to an H level. Lower limit detection signal SIG maintains the H level thereafter during equalization of external power supply voltage ExtVcc and reference voltage Vref.

When the difference between external power supply voltage ExtVcc and reference voltage Vref becomes smaller than a predetermined value, lower limit detection signal SIG is driven to an active state of an H level, so that the level adjustment operation of internal power supply voltage IntVcc can be carried out. By appropriately adjusting the input logic threshold voltage of buffer circuit 1_ab_, lower limit detection signal SIG can be driven to an H level when external power supply voltage Extvcc and reference voltage Vref attain the same voltage level.

Figure 11B:
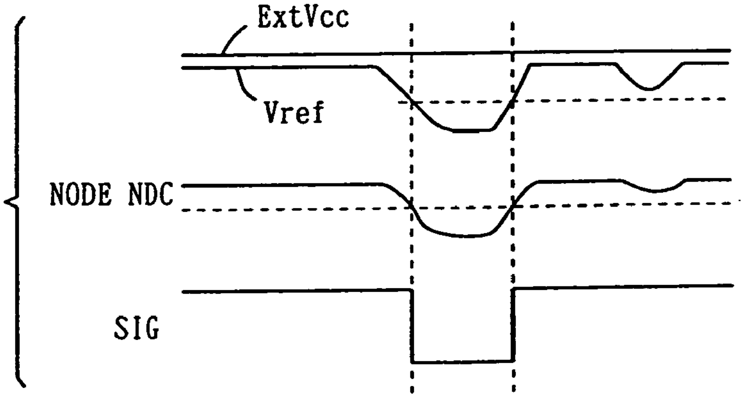

The operation when reference voltage Vref is subject to noise will be described with reference to FIG. 11B. In general, a semiconductor integrated circuit includes an output drive circuit (output buffer) to drive an external large load. At the time of signal output, a great amount of current is consumed to often cause generation of power supply noise. Since main amplifier MA, subamplifier SA and lower limit detection circuit 1*a* all are of a high input impedance (the input stages are all differential amplifiers), the reference voltage generation circuit is not required of a great current supply ability and the output node thereof is at a high impedance state. Therefore, there is possibility that the generated noise is overlaid on reference voltage Vref in the operation of such circuitry. In the case where the semiconductor integrated circuit device including this internal power supply voltage generation circuit is a dynamic random access memory, a large peak current flows in the sense amplifier operation in which data of a selected memory cell is sensed and amplified. Therefore noise is easily generated.

By this noise, the voltage level of node NDC attains a high level, and accordingly lower limit detection signal SIG will not be pulled down to an L level even when reference voltage Vref is varied, unless the difference between reference voltage Vref and external power supply voltage ExtVcc becomes greater than a predetermined value. When the difference between external power supply voltage ExtVcc and reference voltage Vref is small, the level adjusting operation on the internal power supply voltage can be carried out accurately with lower limit detection signal SIG at an active state of an H level with high immunity to the noise effect. Therefore, erroneous operation of lower limit detection circuit 1*a* can be prevented against variation in reference voltage Vref due to noise or a constant leakage current.

By increasing the channel width of the MOS transistor receiving reference voltage Vref at its gate out of the MOS transistors forming the comparator stage in the differential amplifier of this lower limit detection circuit, a lower limit detection operation can be carried out accurately without being affected by the noise of reference voltage Vref to properly carry out the level adjustment of internal power supply voltage, In other words, when the difference between external power supply voltage ExtVcc and reference voltage Vref becomes smaller than a predetermined value to make high the possibility of reduction in the gain of main amplifier MA, the level of internal power supply voltage IntVcc can be adjusted. By utilizing the structure of the second or third embodiment for adjusting the level of internal power supply voltage IntVcc when the difference between external power supply voltage ExtVcc and reference voltage Vref becomes smaller than a predetermined value, a sudden flow of a large current towards the internal power supply line can be prevented. Internal power supply voltage IntVcc can be reliably prevented from rising to a level higher than reference voltage Vref, so that an internal power supply voltage of a desired voltage level can be generated.

According to the fourth embodiment of the present invention, out of the MOS transistors forming the comparator stage of the differential amplifier in the lower limit detection circuit for detecting the lower limit of an external power supply voltage, the channel width of the MOS transistor receiving reference voltage Vref at its gate is set greater than that of the MOS transistor receiving external power supply voltage ExtVcc at its gate. Therefore, the lower limit of an external power supply voltage can be sensed stably to allow level adjustment of the internal power supply voltage against the noise of reference voltage or a constant leakage current.

Fifth Embodiment

Figure 12:
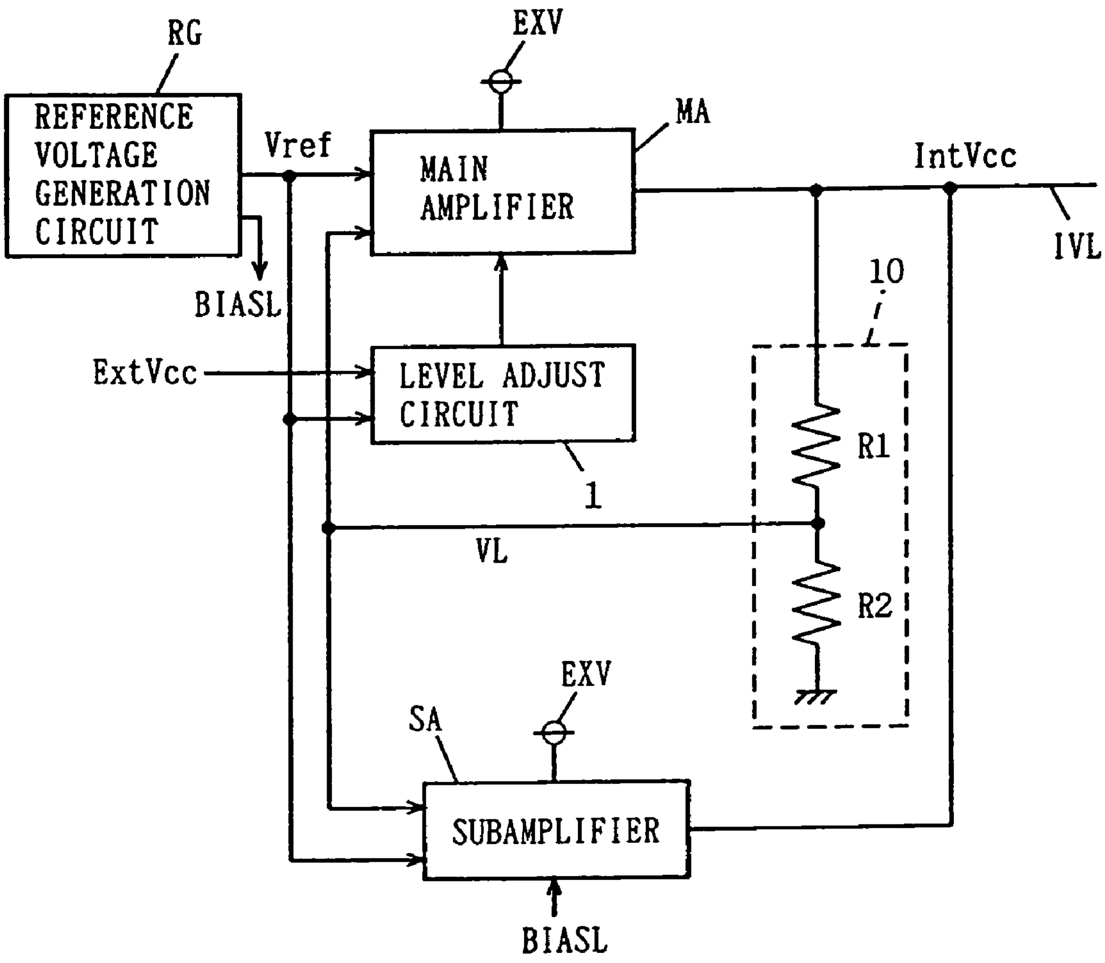
FIG. 12 schematically shows a structure of an internal power supply voltage generation circuit according to a fifth embodiment of the present invention.
Figure 13:
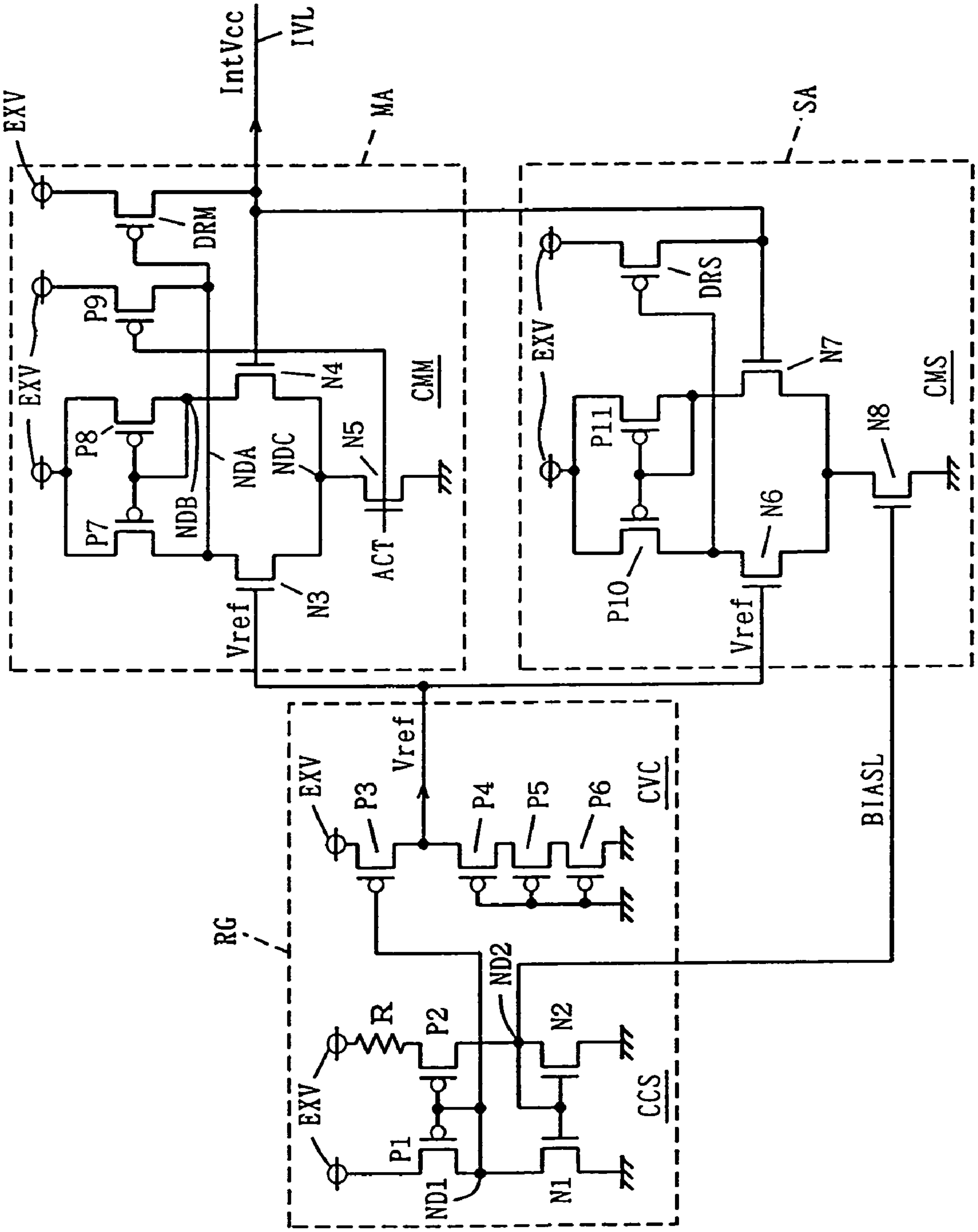
FIG. 13 PRIOR ART
FIG. 13 shows a structure of a conventional internal power supply voltage generation circuit.

FIG. 12 schematically shows a structure of an internal power supply voltage generation circuit according to a fifth embodiment of the present invention. In the structure of FIG. 12, a level shift circuit 10 is provided for reducing the level of internal power supply voltage IntVcc on internal power supply line IVL. A shifted voltage VL from level shift circuit 10 is supplied to main amplifier MA and subamplifier SA as a voltage to be compared. The remaining structure is identical to that shown in FIG. 1, and corresponding components have the same reference characters allotted, and detailed description thereof will not be repeated. Main amplifier MA and level adjust circuit 1 may have a structure of any of the structures shown in the first to fourth embodiments. Subamplifier SA has a structure similar to that of the subamplifier shown in FIG. 13.

Level shift circuit 10 includes resistor elements R1 and R2 connected in series between internal power supply line IVL and the ground node. Level shifted voltage VL is output from the connection node between resistor elements R1 and R2. Main amplifier MA and subamplifier SA each compare reference voltage Vref from reference voltage generation circuit RG with level shifted voltage VL to supply a current to internal power supply line IVL in accordance with the comparison result. By this comparison operation, level shifted voltage VL is set substantially equal to reference voltage Vref. Therefore, internal power supply voltage IntVcc is represented by the following equation.

$$Intvcc=Vref\cdot(R1+R2)/R2$$

By shifting the level of internal power supply voltage IntVcc using level shift circuit 10 and providing level shifted voltage VI to main amplifier MA and subamplifier SA, a comparison operation can be carried out in a region where the sensitivity of main amplifier MA and subamplifier SA is good. It is to be noted that main amplifier MA includes a differential amplifier as a comparator at the input stage, and has an internal node restricted in the level of the lower limit voltage. Therefore, there is a problem that the amount of reduction in internal power supply voltage IntVcc is increased when the difference between external power supply voltage ExtVcc and reference voltage Vref becomes smaller, as in the case of a direct feedback type internal power supply voltage generation circuit that compares internal power supply voltage IntVcc and reference voltage Vref. When the difference between external power supply voltage ExtVcc and reference voltage Vref becomes smaller than a predetermined value, the amount of current supplied by main amplifier MA from external power supply node EXV to internal power supply line IVL is adjusted by level adjust circuit 1 to suppress reduction in the gain thereof. Accordingly, in the internal power supply voltage generation circuit including a level shift circuit, gain reduction in the main amplifier in the vicinity of the lower limit region of the external power supply voltage can be suppressed. An internal power supply voltage of a required level can be generated accurately and stably over a wide range of the external power supply voltage.

In the structure shown in FIG. 12, subamplifier SA may have a direct feedback type structure that compares internal power supply voltage IntVcc and reference voltage Vref since high speed response is not required therefor. In this case, reference voltage generation circuit RG supplies reference voltages at different levels to main amplifier MA and subamplifier SA. In the structure where level shifted voltage VL output from level shift circuit 10 is applied only to main amplifier MA, level shift circuit 10 may include a switching transistor that cuts off the current path from internal power supply line IVL to the ground node when activation control signal ACT is inactive.

In the structure of a level shift type internal power supply voltage generation circuit according to the fifth embodiment of the present invention, reduction in internal power supply voltage IntVcc in the vicinity of the lower limit region of the operating range of the external power supply voltage can be suppressed since the amount of current supplied from the external power supply node to the internal power supply line by the main amplifier is adjusted according to the difference between external power supply voltage ExtVcc and reference voltage Vref. Therefore, the internal circuit can be operated stably over a wide operating voltage range of external power supply voltage.

Although the present invention h as been described and illustrated in detail, it is clearly understood that the same is by way of illustration and example only and is not to be taken by way of limitation, the spirit and scope of the present invention being limited only by the terms of the appended claims.

What is claimed is:

1. Level detection circuitry for detecting a difference between a first voltage and a second voltage, comprising:

a differential stage including a first insulated gate transistor and a second insulated gate transistor, said first insulated gate transistor receiving a power supply voltage as the first voltage at a gate thereof and having a first conduction node, and a second conduction node for outputting a difference signal, and said second insulated gate transistor receiving a reference voltage as the second voltage at a gate thereof and having a first conduction node connected to said first conduction node of said first insulated gate transistor, said second insulated gate transistor having a current supply ability different from a current supply ability of said first insulated gate transistor under a condition of the same gate voltage, and said difference signal corresponding to a difference between the first and second voltages, said reference voltage determining a voltage level of an internal voltage generated from said power supply voltage;

operation current supply circuitry for supplying an operation current to the first and second insulated gate transistors, said operation current supply circuitry comprising a current mirror coupled to the first and second insulated gate transistors for supplying current to the first and second insulated gate transistors; and a buffer circuit for buffering said difference signal for generating a binary level detection signal indicating whether said first voltage is higher than said second voltage.

2. The level detection circuitry according to claim 1, wherein said first insulated gate transistor is smaller in channel width than said second insulated gate transistor.

* * * * *